(12) United States Patent
Maeda et al.

(10) Patent No.: US 8,233,289 B2
(45) Date of Patent: Jul. 31, 2012

(54) MULTILAYER WIRING SUBSTRATE AND METHOD FOR MANUFACTURING THE SAME

(75) Inventors: Shinnosuke Maeda, Nagoya (JP); Toshiya Asano, Ichinomiya (JP); Takuya Hando, Inuyama (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 348 days.

(21) Appl. No.: 12/706,255

(22) Filed: Feb. 16, 2010

(65) Prior Publication Data

US 2010/0208437 A1    Aug. 19, 2010

(30) Foreign Application Priority Data

Feb. 16, 2009    (JP) .................................. 2009-33315

(51) Int. Cl.
*H05K 1/11* (2006.01)
(52) U.S. Cl. ........ 361/795; 361/760; 361/762; 175/257; 175/250
(58) Field of Classification Search .................. 361/795, 361/760, 762, 792; 174/257, 250
See application file for complete search history.

(56) References Cited

U.S. PATENT DOCUMENTS

| | | | |
|---|---|---|---|
| 6,812,412 B2 * | 11/2004 | Obata et al. | 174/261 |
| 2006/0102384 A1 * | 5/2006 | Watanabe et al. | 174/256 |

FOREIGN PATENT DOCUMENTS

JP    2002-26500    1/2002

* cited by examiner

*Primary Examiner* — Yuriy Semenenko
*Assistant Examiner* — Andargie M Aychillhum
(74) *Attorney, Agent, or Firm* — Stites & Harbison PLLC; Jeffrey A. Haeberlin

(57) ABSTRACT

A multilayer wiring substrate of the present invention has a laminated structure composed of conductor layers and resin insulating layers stacked alternately. A plurality of surface connection terminals to which terminals of a chip component are to be surface-connected are formed on a main face of the laminated structure. A plurality of via conductors connected to the plurality of surface connection terminals are formed in the resin insulating layers. Each of the plurality of surface connection terminals has a structure in which a copper layer, a nickel layer, and a gold layer are stacked in this sequence. The gold layer is larger in diameter than at least the copper layer. The gold layer has an overhanging portion which extends radially outward from a circumference of the copper layer.

9 Claims, 14 Drawing Sheets

MULTILAYER WIRING SUBSTRATE AND METHOD FOR MANUFACTURING THE SAME

CROSS-REFERENCE TO RELATED APPLICATIONS

This application claims priority to Japanese Patent Application No. JP 2009-33315, filed Feb. 16, 2009, which is hereby incorporated by reference in its entirety.

BACKGROUND OF THE INVENTION

1. Field of the Invention

The present invention relates to a multilayer wiring substrate having a laminated structure composed of conductor layers and resin insulating layers alternately stacked, and to a method for manufacturing the same.

2. Description of Related Art

In recent years, semiconductor integrated circuit elements (IC chips) used as microprocessors of computers or the like have been enhanced in speed and function more and more, and, thus, IC chips tend to have an increased number of terminals and a reduced inter-terminal pitch. In general, a large number of terminals are densely disposed in an array on the bottom surface of an IC chip. Such a group of terminals are flip-chip connected to a group of terminals on the motherboard. However, since the inter-terminal pitch differs greatly between the IC chip side terminal group and the motherboard side terminal group, difficultly is encountered in connecting the IC chip directly onto the motherboard. Therefore, in general, a semiconductor package including an IC chip mounted on an IC-chip mounting wiring substrate is fabricated, and is then mounted on a motherboard (see, for example, Japanese Patent Application Laid-Open (kokai) No. 2002-26500 (FIG. 1, etc.)).

Notably, an IC-chip mounting wiring substrate is manufactured, for example, through the following steps. First, a copper foil layer is disposed on a support substrate, and a predetermined mask is disposed on the copper foil layer. Subsequently, a gold layer, a nickel layer, and a copper layer are stacked, in this sequence, on portions of the copper foil layer exposed from the opening portions of the mask. As a result, surface connection terminals, on which solder bumps for connection of an IC chip are disposed, are formed (terminal forming step). Subsequently, after the mask is removed, a resin insulating layer for covering the surface connection terminals is formed on the support substrate (resin-insulating-layer forming step). Further, via conductors connected to the surface connection terminals are formed in the resin insulating layer. Conductor layers and resin insulating layers are alternately stacked so as to form a laminated structure. After that, the support substrate is peeled off, and the copper foil layer is removed through etching (removal step), whereby a multilayer wiring substrate having a laminated structure can be obtained.

BRIEF SUMMARY OF THE INVENTION

However, when the copper foil layer is removed through etching in the above-described conventional production process, etchant may invade into the interior of the laminated structure via the interfaces between the surface connection terminals and the resin insulating layers. In such a case, the copper layer of each surface connection terminal is likely to be etched out, which raises a problem of unsatisfactory yield of the multilayer wiring substrate. The deteriorated shape of the surface connection terminals caused by the etching out may lower the reliability of connection between the surface connection terminals and an IC chip.

The present invention has been accomplished in order to solve the above-described problem, and its object is to provide a method of manufacturing a multilayer wiring substrate which can prevent etching out of surface connection terminals, to thereby improve the yield of the multilayer wiring substrate. Another object of the present invention is to provide a multilayer wiring substrate having surface connection terminals which are excellent in terms of the reliability of connection between the surface connection terminals and a chip component.

A means (first means) for solving the above-described problem is a method for manufacturing a multilayer wiring substrate which has a laminated structure composed of conductor layers and resin insulating layers stacked alternately and in which a plurality of surface connection terminals to which terminals of a chip component are to be surface-connected are formed on a main face of the laminated structure, a plurality of via conductors connected to the plurality of surface connection terminals are formed in the resin insulating layers, and the plurality of surface connection terminals have a structure in which a copper layer, a nickel layer, and a gold layer are stacked (preferably, in this sequence). The method comprises: a terminal forming step of placing a mask on a support layer formed of a copper foil (which will be removed later), and stacking the gold layer, the nickel layer, and the copper layer (in this sequence) on portions of the copper foil exposed from openings of the mask, thereby forming the plurality of surface connection terminals; a resin-insulating-layer forming step of forming, after removal of the mask, a resin insulating layer which covers the surface connection terminals; a conductor forming step of forming via conductors in the resin insulating layer and forming a conductor layer on the resin insulating layer; and a support-layer removing step of removing the support layer after the conductor forming step so as to expose the gold layer of each of the plurality of surface connection terminals. In the terminal forming step, for each of the plurality of surface connection terminals, the gold layer is formed such that the gold layer is larger in diameter than at least the copper layer and has an overhanging portion which extends radially outward from a circumference of the copper layer.

According to the invention of the first means, since the gold layer formed in the terminal forming step has an overhanging portion, a non-linear interface is formed between each surface connection terminal and the resin insulating layer as viewed in a cross section, and the interface is longer of the conventional structure. Therefore, even when the support layer is removed by means of, for example, etching in a later step, etchant hardly invades into the interior of the laminated structure via the interface. Therefore, etching out of the copper layer, which would otherwise occur due to invasion of the etchant, can be prevented, whereby surface contact terminals which are excellent in terms of shape can be obtained at high yield. Further, the reliability of connection between the surface connection terminals and a chip component can be improved.

As the above-described multilayer wiring substrate, there is used a multilayer wiring substrate which has a laminated structure composed of conductor layers and resin insulating layers stacked alternately, and is configured such that a plurality of surface connection terminals to which terminals of a chip component are to be surface-connected are formed on a main face of the laminated structure, and a plurality of via conductors connected to the plurality of surface connection terminals are formed in the resin insulating layers. The materials of the multilayer wiring substrate may be properly selected in consideration of cost, machinability, insulation property, mechanical strength, etc.

Examples of the chip component include chip capacitors, semiconductor integrated circuit elements (IC chips), and MEMS (Micro Electro Mechanical Systems) elements manufactured through a semiconductor manufacturing process. Specific examples of IC chips include DRAM (Dynamic Random Access Memory) and SRAM (Static Random Access Memory). The "semiconductor integrated circuit element" refers to an element which is mainly used as a microprocessor of a computer or the like. Further, other examples of the chip component include chip transistors, chip diodes, chip resistors, chip coils, and chip inductors.

Incidentally, in recent years, in order to cope with an increase in operation speed of a semiconductor integrated circuit element, a signal frequency within a high-frequency band is employed. In such a case, if a multilayer wiring substrate includes a core substrate, wiring passing through the core substrate produces a large inductance, resulting in generation of transmission loss of high frequency signals and/or occurrence of a malfunction of a circuit. Therefore, the core substrate prevents the semiconductor integrated circuit element from operating at a higher speed. In view of this, preferably, the multilayer wiring substrate manufactured by the method according to the above-described means is a so-called coreless wiring substrate which is mainly formed of the resin insulating layers of the same configuration, and the conductor layers of the resin insulating layers are connected together only through the via conductors whose diameter increases toward the same direction. When such a configuration is employed, the length of wiring can be shortened through elimination of a relatively thick core substrate. Thus, transmission loss of high-frequency signals can be reduced, whereby the semiconductor integrated circuit element can be operated at a higher speed.

The plurality of surface connection terminals have a structure in which a copper layer, a nickel layer, and a gold layer are stacked in this sequence. The gold layer, which is the outermost layer, is formed to be larger in diameter than at least the copper layer and have an overhanging portion which extends radially outward from the circumference of the copper layer. For example, the gold layer may be formed to be larger in diameter than the nickel layer and the copper layer and have an overhanging portion which extends radially outward from the circumferences of the nickel and copper layers. In this case, the nickel and copper layers, which are smaller in diameter than the gold layer, may be formed to have different diameters or the same diameter. Alternatively, the gold and nickel layers may be formed to be larger in diameter than the copper layer and each have an overhanging portion which extends from the circumference of the copper layer. In this case, the gold and nickel layers may be formed to have different diameters or the same diameter.

No limitation is imposed on the projection amount of the overhanging portion of the gold layer (or the gold and nickel layers); however, the projection amount is preferably equal to or greater than 1 μm, and, more preferably, falls within a range of 1 μm to 50 μm, inclusive. When the projection amount of the overhanging portion is less than 1 μm, the invasion of etchant cannot be prevented reliably. Meanwhile, when the projection amount of the overhanging portion is excessively large, in some cases, the clearance for insulation between the surface contact terminals becomes narrow.

No limitation is imposed on the respective thicknesses of the copper, nickel, and gold layers of each surface contact terminal; however, in general, these layers are formed such that the thickness decreases in this sequence from the viewpoint of cost and other factors. That is, the copper, nickel, and gold layers are formed such that the nickel layer becomes thinner than the copper layer and the gold layer becomes thinner than the nickel layer.

Although the surface of the overhanging portion, which is a portion of the gold layer, may be flat, the surface may have fine pits and projections; i.e. a surface roughness Ra of 0.1 μm to 5 μm, inclusive. Further, the fine pits and projections may exist over the entre surface of the gold layer and/or on the surface of the resin insulating layer around the gold layer.

In a region of the main face of the multilayer wiring substrate where the plurality of surface connection terminals are not formed, for example, a positioning mark may be formed, which has the same structure as the surface connection terminals. Such a positioning mark facilitates accurate positioning of a chip component when it is mounted on the multilayer wiring substrate.

A method for manufacturing a multilayer wiring substrate according to the first means will next be described.

In the terminal forming step, a mask is placed on a support layer formed of a copper foil, which will be removed later; and a gold layer, a nickel layer, and a copper layer are stacked in this sequence on portions of the support layer (copper foil) exposed from openings of the mask, whereby the plurality of surface connection terminals are formed.

The gold layer, the nickel layer, and the copper layer can be formed by a known method, such as a subtractive process, a semi-additive process, or a full-additive process. Specifically, for example, etching of metal foil (gold foil, nickel foil, copper foil), electroless plating (electroless gold plating, electroless nickel plating, electroless copper plating), electro plating (electro gold plating, electro nickel plating, electro copper plating), or the like process is applied. Notably, the gold layer, the nickel layer, and the copper layer may be formed through printing of electrically conductive paste or the like. Further, for the relatively thin gold layer, sputtering, CVD, or a like method can be employed.

Here, there will be described three specific methods for forming the surface contact terminals having the above-described structure. In the first method, a mask is placed on the support layer; openings are formed in the mask on the support layer; portions of the support layer (copper foil) exposed from the openings are soft-etched such that, around each of the openings, a clearance is formed in a region under a surface of the mask which surface is in contact with the support layer; and the gold layer is formed. In the second method, a mask is placed on the support layer; openings are formed in the mask on the support layer such that, around each of the openings, an undercut is formed on the surface of the mask in contact with the support layer; and the gold layer is formed. In the third method, a first mask is placed on the support layer; first openings are formed in the first mask on the support layer; the gold layer is formed on portions of the support layer (copper foil) exposed from the first openings; the first mask is removed and a second mask is placed on the support layer; second openings which are smaller in diameter than the first openings are formed in the second mask on the support layer; and the nickel layer and the copper layer are successively formed on portions of the gold layer exposed from the second openings.

In the subsequent resin-insulating-layer forming step, the resin insulating layer which covers the surface connection terminals is formed after removal of the mask. The resin insulating layer can be properly selected in consideration of insulation property, heat resistance, moisture resistance, etc.

Examples of a polymeric material used for forming the resin insulating layer include thermosetting resins, such as epoxy resin, phenol resin, urethane resin, silicone resin, and polyimide resin; thermoplastic resins, such as polycarbonate resin, acrylic resin, polyacetal resin, and polypropylene resin; etc. Alternatively, there may be used a composite material of any of these resins and glass fibers (glass woven fabric or glass unwoven fabric) or organic fibers such as polyamide fibers; or a resin-resin composite material formed by impregnating a three-dimensional network fluorine-based resin matrix, such as an interconnected porous PTFE, with a thermosetting resin, such as epoxy resin.

In the subsequent conductor forming step, the via conductors are formed in each of the resin insulating layers, and the conductor layer is formed on each of the resin insulating layers. The conductor layer is mainly formed of copper through a known process such as a subtractive process, a semi-additive process, or a full-additive process. Specifically, for example, etching of copper foil, electroless copper plating, electro copper plating, or the like process is applied. Notably, the conductor layer may be formed through etching of a thin film formed by spattering, CVD, or the like; or through printing of electrically conductive paste or the like.

In the subsequent support-layer removing step, the support layer is removed whereby the gold layers of the plurality of surface connection terminals are exposed, whereby a multilayer wiring substrate can be obtained. Notably, a bump forming step of forming bumps on the plurality of surface connection terminals may be performed after the support-layer removing step.

Another means (second means) for solving the above-described problem is a multilayer wiring substrate having a laminated structure composed of conductor layers and resin insulating layers stacked alternately and in which a plurality of surface connection terminals to which terminals of a chip component are to be surface-connected are formed on a main face of the laminated structure, and a plurality of via conductors connected to the plurality of surface connection terminals are formed in the resin insulating layers, the multilayer wiring substrate being characterized in that the plurality of surface connection terminals have a structure in which a copper layer, a nickel layer, and a gold layer are stacked in this sequence, and the gold layer is formed such that the gold layer is larger in diameter than at least the copper layer and has an overhanging portion which extends radially outward from the circumference of the copper layer.

According to the invention of the above-described second means, the area of the gold layer increases somewhat as compared with the conventional structure in which the gold layer, the nickel layer, and the copper layer have the same diameter. This configuration is convenient for formation of solder bumps on the surface connection terminals, and enhances the reliability of the solder bumps. Thus, the reliability of connection between the surface connection terminals and a chip component can be improved. Further, since the gold layer has an overhanging portion, the area of the interface between each surface connection terminal and the resin insulating layer increases somewhat, whereby the fixing strength of the surface connection terminals to the resin insulating layer can be increased.

Other features and advantages of the invention will be set forth in, or apparent from, the detailed description of the exemplary embodiment(s) of the invention found below.

DETAIL DESCRIPTION OF EXEMPLARY EMBODIMENTS OF THE INVENTION

1. First Embodiment

A semiconductor package 10 according to a first exemplary embodiment of the present invention and a method of manufacturing the same will be described in detail with reference to FIGS. 1 to 21.

Figure 1:
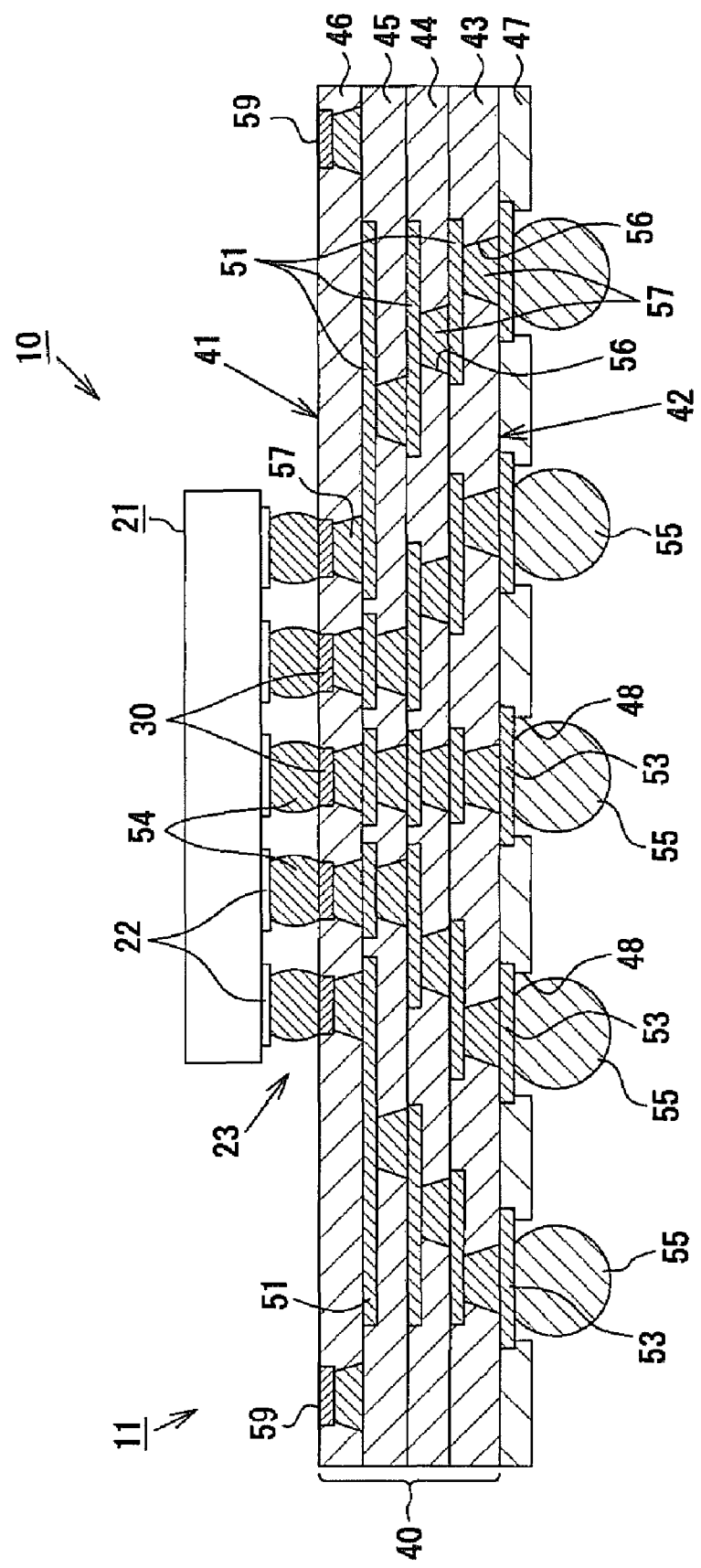
FIG. 1 is a schematic cross sectional view showing a semiconductor package which uses a multilayer wiring substrate of a first embodiment of the present invention.
Figure 2:
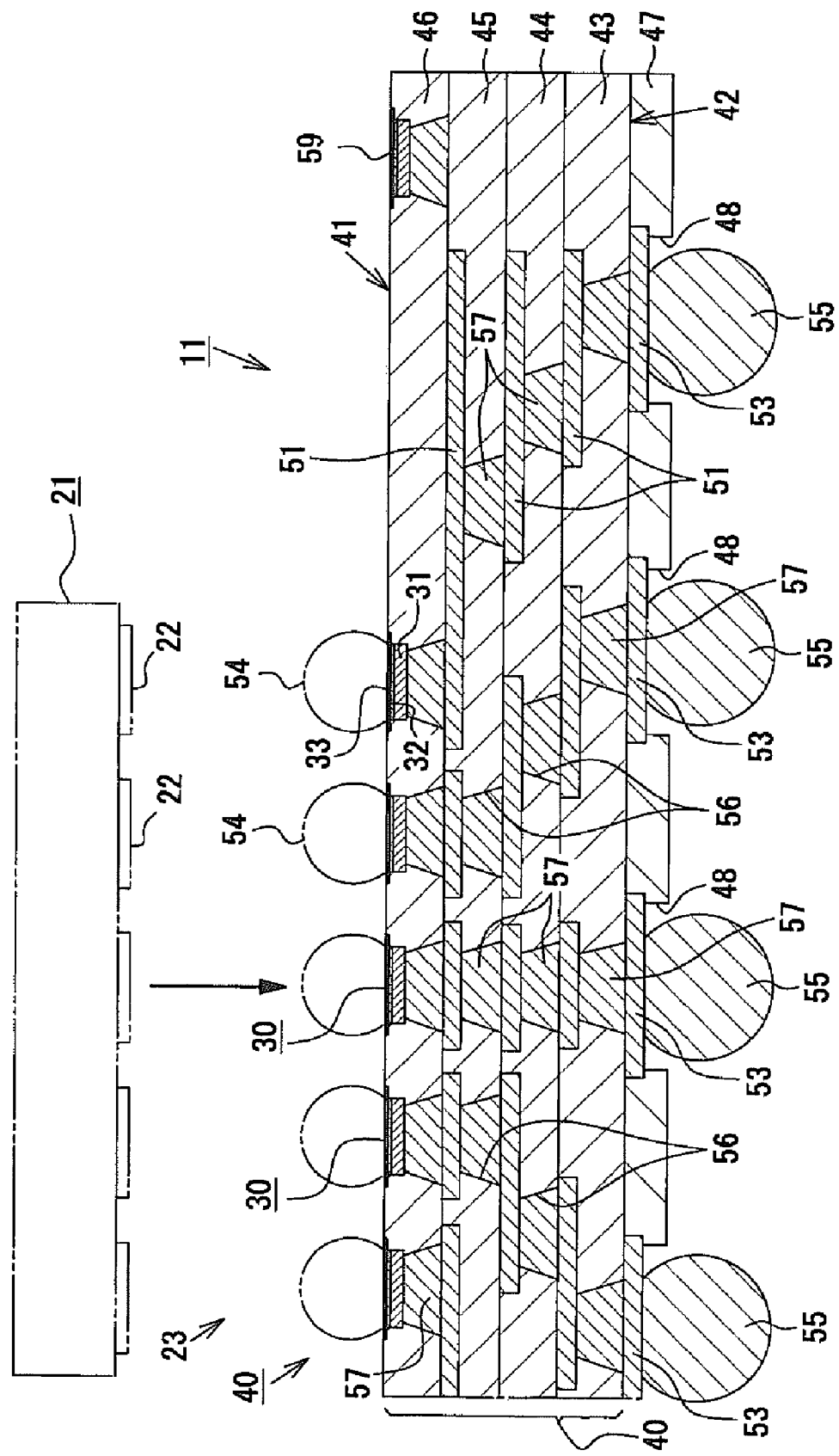
FIG. 2 is a partial schematic cross sectional view showing the multilayer wiring substrate of the first embodiment.

As shown in FIGS. 1 and 2, the semiconductor package 10 of the present embodiment is of a BGA (ball grid array) type, and is composed of a multilayer wiring substrate 11 and a IC chip 21 (chip component), which is a semiconductor integrated circuit element. Notably, the type of the semiconductor package 10 is not limited to BGA, and may be PGA (pin grid array), LGA (land grid array), or the like. The IC chip 21 is preferably formed of silicon whose coefficient of thermal expansion is 4.2 ppm/° C. and assumes the form of a rectangular flat plate whose size is 15.0 mm (length)×15.0 mm (width)×0.8 mm (thickness).

Meanwhile, the exemplary multilayer wiring substrate 11 does not have a core substrate, and has a wiring stacked portion 40 (laminated structure) composed of conductor layers 51 formed of copper and four resin insulating layers 43, 44, 45, and 46, which are alternately stacked with the conductor layers 51. The wiring stacked portion 40 of the present embodiment preferably assumes a generally rectangular shape as viewed from above, and has a size of 50.0 mm (length)×50.0 mm (width)×0.4 mm (thickness). In the present embodiment, the coefficient of thermal expansion of the resin insulating layers 43 to 46 is about 10 to 60 ppm/° C. (specifically, about 20 ppm/° C.). Notably, the coefficient of thermal expansion of the resin insulating layers 43 to 46 refers to the average value of measurement values between 30° C. and glass transition temperature (Tg).

Figure 3:
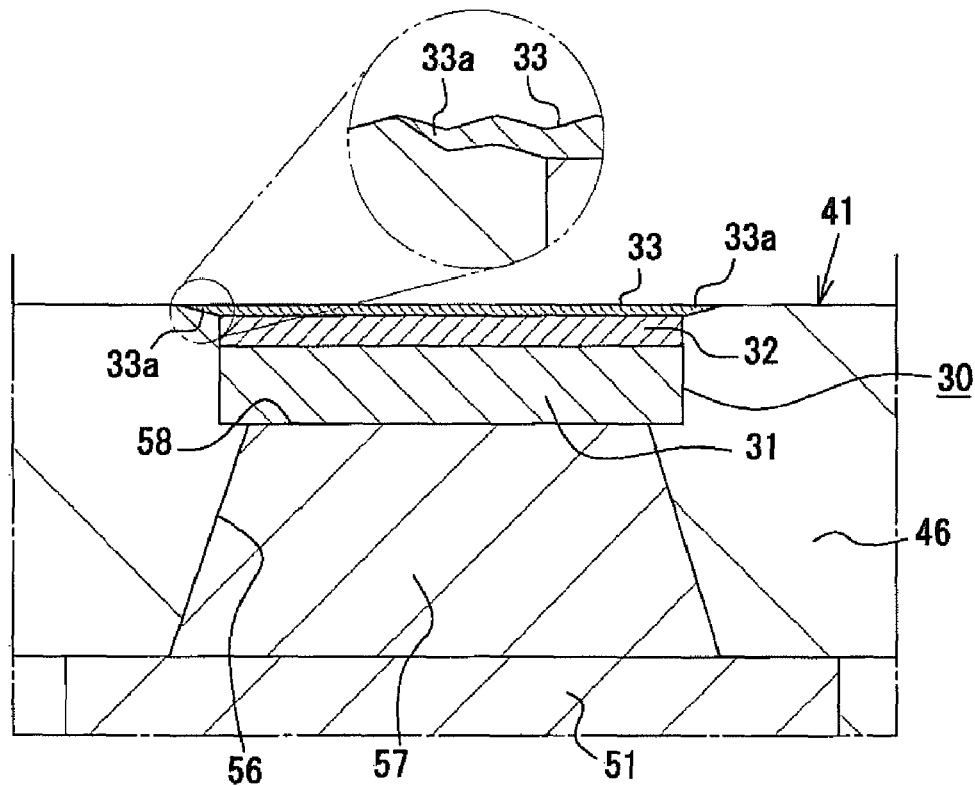
FIG. 3 is an enlarged cross sectional view showing a surface contact terminal of the first embodiment.

As shown in FIGS. 1 and 2, a plurality of terminal pads 30 (surface connection terminals) are disposed in an array on a main face 41 of the wiring stacked portion 40 (on the surface of the fourth resin insulating layer 46). As shown in FIG. 3, each of the terminal pads 30 has a laminated structure in which a copper plating layer 31 (copper layer), a nickel plating layer 32 (nickel layer), and a gold plating layer 33 (gold layer) are stacked in this sequence. The thickness of the copper plating layer 31 is set to be not less than 10 μm but less than 20 μm (in the present embodiment, 10 μm. The thickness of the nickel plating layer 32 is set to be not less than 3 μm but less than 10 μm (in the present embodiment, 5 μm). The thickness of the gold plating layer 33 is set to be not less than 0.1 μm but less than 3 μm (in the present embodiment, 0.5 μm).

Figure 4:
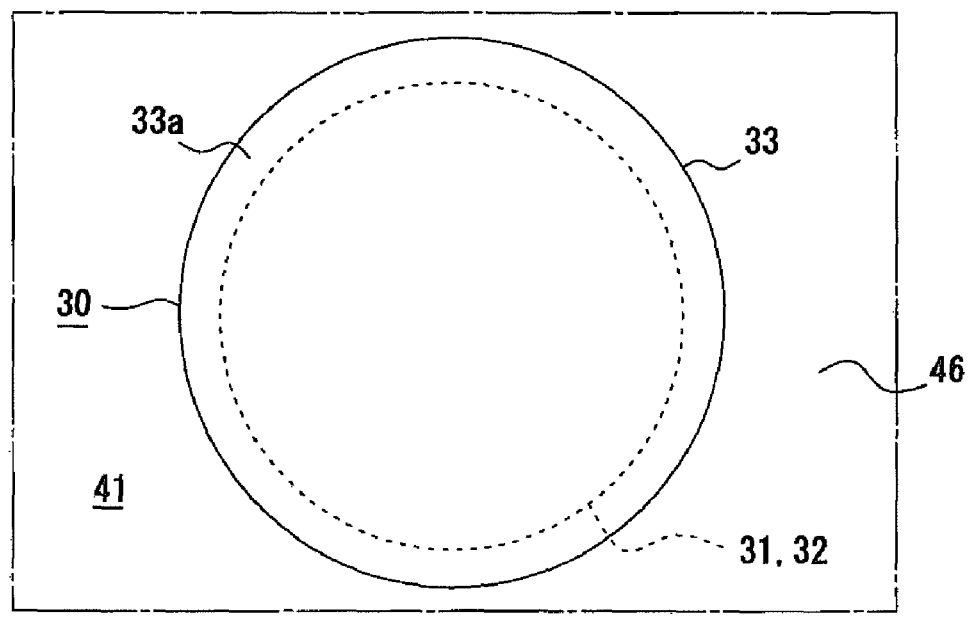
FIG. 4 is an enlarged plan view showing the surface contact terminal of the first embodiment.

As shown in FIGS. 3 and 4, the gold plating layer 33, which is the outermost layer of each terminal pad 30 is formed to be larger in diameter than the nickel plating layer 32 and the copper plating layer 31. The gold layer 33 has an overhanging portion 33a which projects radially outward from the circumferences of the nickel plating layer 32 and the copper plating layer 31 (that is, in the left-right direction in FIGS. 3 and 4). In the present embodiment, the projection amount of the overhanging portion 33a is set to about 1 μm to 2 μm. Fine pits and projections are present over the entire surface of the gold plating layer 33 and on the surface of the resin insulating layer 46 around the gold plating layer 33. Therefore, the surface of the overhanging portion is also a roughened surface rather than a smooth surface. In the present embodiment, the roughened surface has a surface roughness Ra of about 2 μm to 3 μm.

In a region of the main face 41 of the wiring stacked portion 40 where the plurality of terminal pads 30 are not formed, there are formed positioning marks 59 which have a three-layer structure identical with that of the terminal pads 30. That is, each of the positioning marks 59 has a structure in which a copper plating layer 31, a nickel plating layer 32, and a gold plating layer 33 are stacked in this sequence, and the gold plating layer 33 has an overhanging portion 33a which projects from the circumference of the gold plating layer 33.

A plurality of solder bumps 54 are disposed on the surfaces of the terminal pads 30. Terminals 22 of the IC chip 21 are surface-connected to the solder bumps 54. The IC chip 21 is mounted on the main face 41 of the wiring stacked portion 40. Notably, a region where the terminal pads 30 and the solder bumps 54 are formed is an IC-chip mounting region 23 in which the IC chip 21 can be mounted.

Meanwhile, as shown in FIGS. 1 and 2, a plurality of pads 53 for BGA are disposed in an array on the back face 42 of the wiring stacked portion 40 (on the lower surface of the first resin insulating layer 43). The pads 53 for BGA have a layered structure in which a nickel plating layer and a gold plating layer are stacked on a copper terminal in this sequence. Further, substantially the entirety of the lower surface of the resin insulating layer 43 is covered with a solder resist layer 47. Opening portions 48 for exposing the pads 53 for BGA are formed in the solder resist layer 47 at predetermined positions thereof. A plurality of solder bumps 55 for motherboard connection are disposed on the surfaces of the pads 53 for BGA, and the wiring stacked portion 40 is mounted on an unillustrated motherboard via the solder bumps 55.

As shown in FIGS. 1 to 3, each of the resin insulating layers 43 to 46 has via holes 56 and via conductors 57 formed therein. The via holes 56, each assuming the form of a truncated cone, are formed through drilling performed for each of the resin insulating layers 43 to 46 by use of a YAG laser or carbon dioxide gas laser. The via conductors 57 are conductors whose diameter increases toward the back face 42 of the wiring stacked portion 40 (downward in FIGS. 1 and 2), and establish electrical connection among the conductor layers 51, the terminal pads 30, and the pads 53 for BGA. The terminal pads 30 are connected to the smaller-diameter-side end faces 58 of the via conductors 57 (see FIG. 3).

Next, a method for manufacturing the exemplary multilayer wiring substrate 11 will be described.

The present embodiment employs a method in which a support substrate (glass epoxy substrate or the like) having sufficient strength is prepared, and the conductor layers 51 and the resin insulating layers 43 to 46 of the multilayer wiring substrate 11 (the wiring stacked portion 40) are built up on the support substrate. FIGS. 5 to 20 are explanatory views illustrating the manufacturing method.

Figure 5:
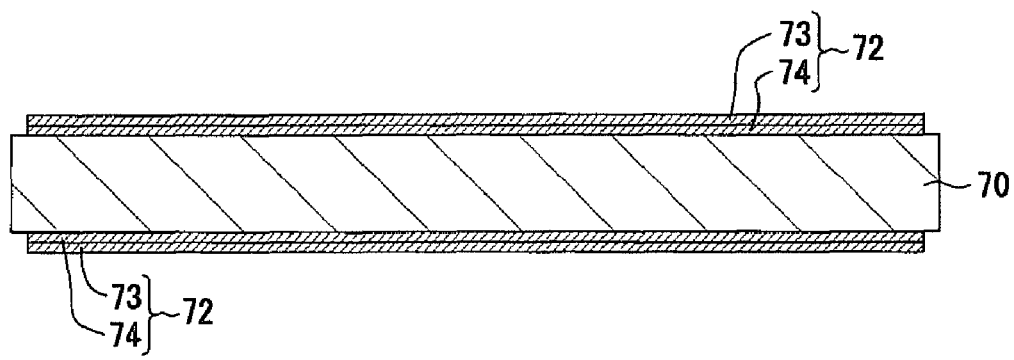
FIG. 5 is a schematic cross sectional view used for explaining the steps of manufacturing the multilayer wiring substrate of the first embodiment.

Specifically, as shown in FIG. 5, a laminated metal sheet 72 (that is, a support layer) is disposed on each of opposite faces of the support substrate 70. Each of the laminated metal sheets 72 is composed of two copper foil layers 73 and 74 separably bonded together. Specifically, each laminated metal sheet 72 is formed by laminating the copper foil layers 73 and 74 with metal plating (e.g., chromium plating) interposed therebetween. A surface of each of the copper foil layers 73 and 74 which surface does not face the opposite copper foil layer is roughened so that fine pits and projections are present thereon.

Figure 6:
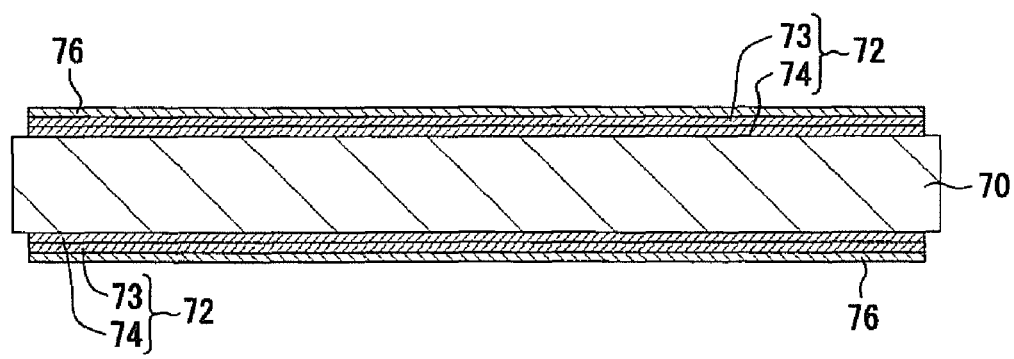
FIG. 6 is a schematic cross sectional view used for explaining the manufacturing steps.
Figure 7:
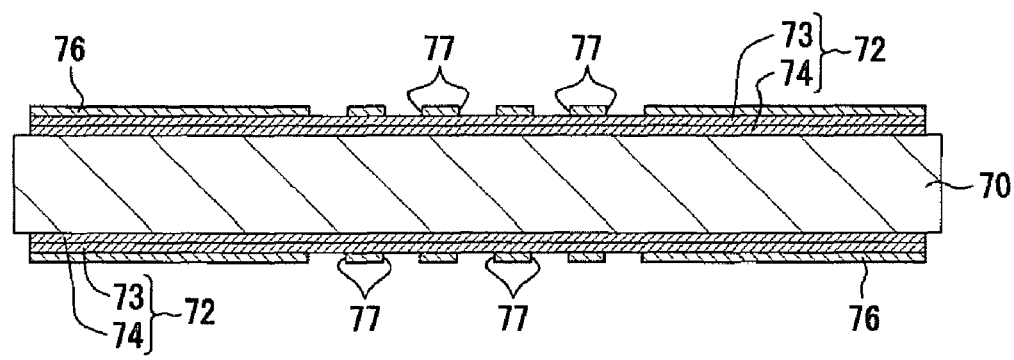
FIG. 7 is a schematic cross sectional view used for explaining the manufacturing steps.
Figure 8:
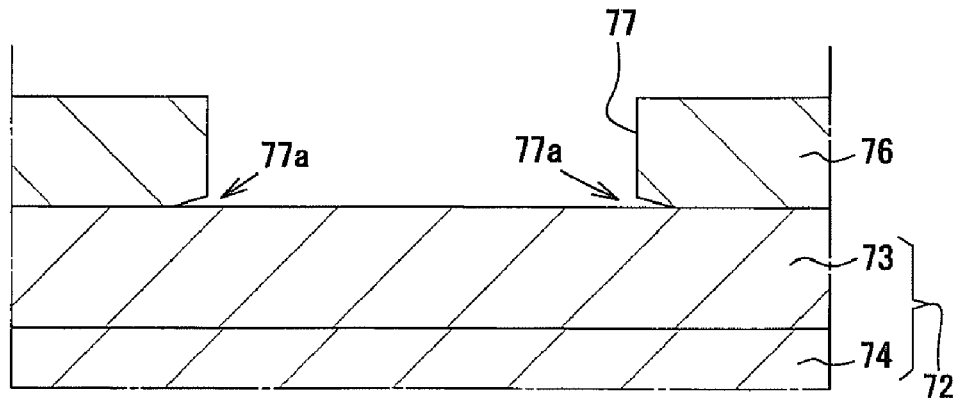
FIG. 8 is a partial enlarged cross sectional view used for explaining the manufacturing steps.

In a subsequent terminal forming step, a dry film 76 (thickness: about 15 μm), which serves as a resist (mask), is laminated on each of the laminated metal sheets 72 (see FIG. 6). Next, through performance of exposure and development, openings 77 (diameter: 100 μm) are formed in the dry film 76 at predetermined positions thereof so as to expose portions of the surface of the copper foil layer 73 (see FIGS. 7 and 8). In the present embodiment, by means of slightly reducing the exposure amount from a proper value, slightly increasing the pressure at the time of development from a proper pressure, or slightly increasing the time of development from a proper value, around each of the openings, an undercut 77a is intentionally formed on the surface of the dry film 76, which surface is in contact with the support layer. The size (the depth of cut) of the undercut 77a is set to about 2 μm to 3 μm.

Figure 9:
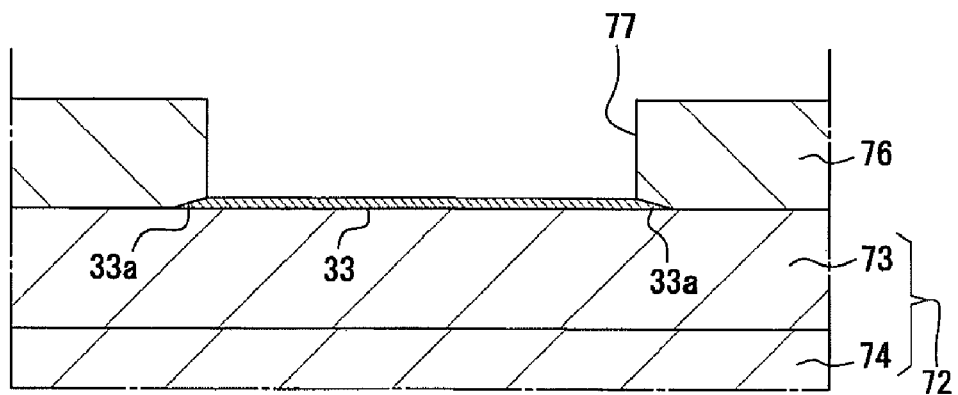
FIG. 9 is a partial enlarged cross sectional view used for explaining the manufacturing steps.
Figure 10:
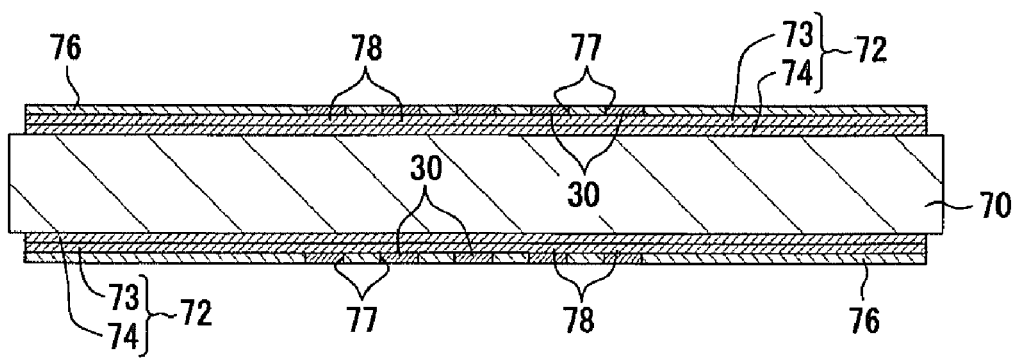
FIG. 10 is a partial enlarged cross sectional view used for explaining the manufacturing steps.
Figure 11:
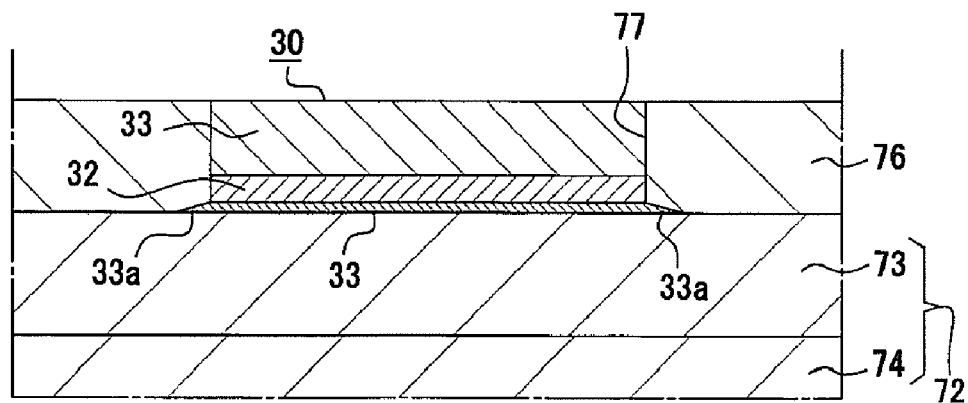
FIG. 11 is a partial enlarged cross sectional view used for explaining the manufacturing steps.
Figure 12:
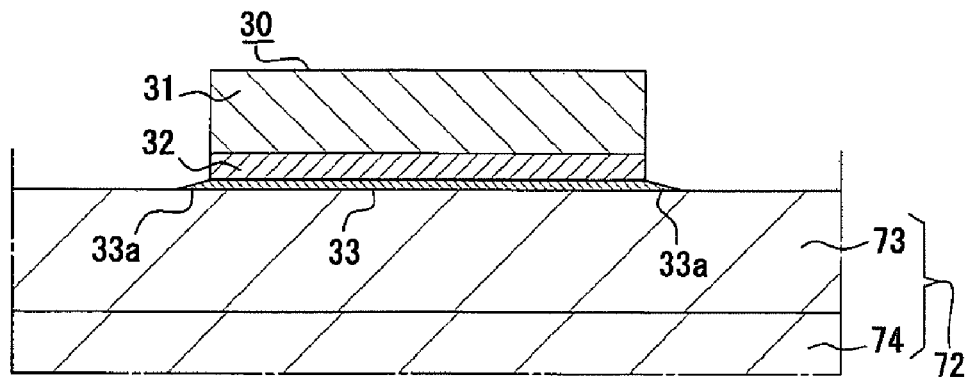
FIG. 12 is a partial enlarged cross sectional view used for explaining the manufacturing steps.
Figure 13:
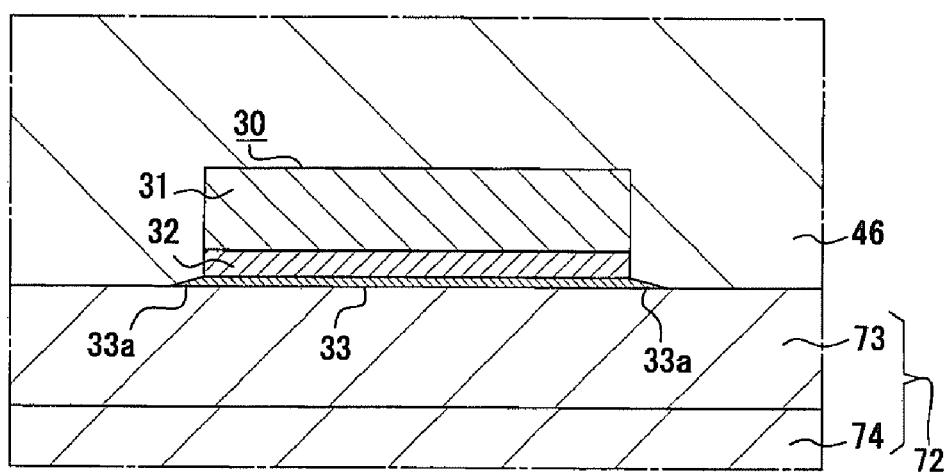
FIG. 13 is a partial enlarged cross sectional view used for explaining the manufacturing steps.

Subsequently, a gold plating layer 33, a nickel plating layer 32, and a copper plating layer 31 are stacked in this sequence on portions of the copper foil layer 73 exposed from the openings 77, whereby the terminal pads 30 are formed (see FIGS. 9 to 11). More specifically, electro gold plating is first performed so as to form a gold plating layer 33 having a predetermined thickness as shown in FIG. 9. In the present embodiment, electro gold plating is performed to an extent such that gold fills a portion (a large diameter portion) of the opening 77 where the undercut 77a is present. Subsequently, electro nickel plating is performed such that nickel fills a portion (a small diameter portion) of the opening 77 where the undercut 77a is not present, whereby a nickel plating layer 32 having a predetermined thickness is formed on the gold plating layer 33. Further, electro copper plating is performed such that a copper plating layer 31 having a predetermined thickness is formed on the nickel plating layer 32. Thus, the terminal pads 30 are completed (FIG. 11). After that, the dry film 76 is removed (see FIG. 12).

Notably, in the terminal forming step, the openings 77 are formed at locations where the positioning marks 59 are to be formed. A gold plating layer 33, a nickel plating layer 32, and a copper plating layer 31 are stacked in this sequence on portions of the copper foil layer 73 exposed at the locations, whereby the positioning marks 59 are formed. Accordingly, at least at this point in time, the terminal pads 30 and the positioning marks 59 have the same structure. Further, the gold plating layer 33 of each of the terminal pads 30 and the positioning marks 59 has an overhanging portion 33a formed integrally therewith.

Figure 14:
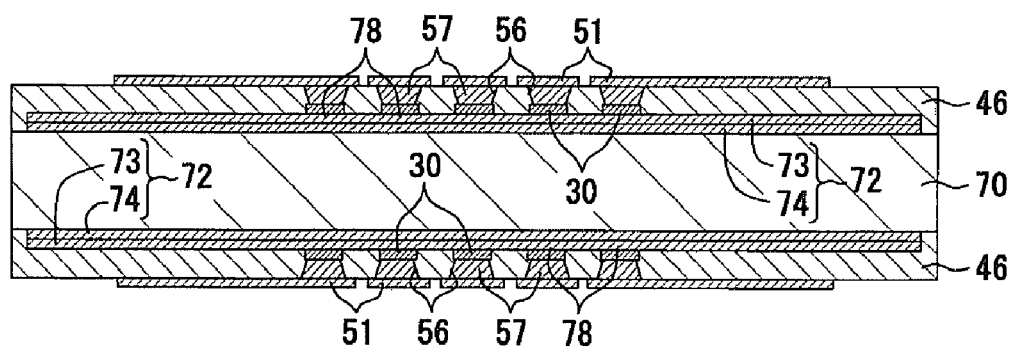
FIG. 14 is a partial enlarged cross sectional view used for explaining the manufacturing steps.

In a subsequent resin-insulating-layer forming step, sheet-like insulating resin base materials (not shown) are stacked on both the laminated metal sheets 72; pressure and heat are applied to the resultant laminate under vacuum by use of a vacuum-bonding hot press machine (not shown); and the laminate is cured, whereby the fourth resin insulating layers 46, which cover the terminal pads 30, are formed (see FIG. 14). Subsequently, through laser machining, the via holes 56 are formed in the resin insulating layers 46 at predetermined positions thereof, and a conventionally known desmearing process is performed so as to remove smears within the via holes 56.

Figure 15:
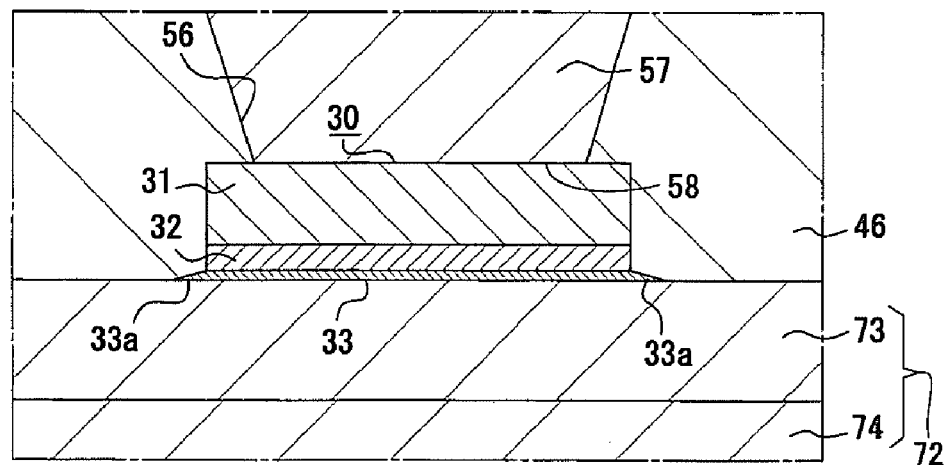
FIG. 15 is a partial enlarged cross sectional view used for explaining the manufacturing steps.

In a subsequent conductor forming step, electroless copper plating and electro copper plating are performed in accordance with a conventionally known method, whereby the via conductors 57 are formed within the via holes 56 (see FIGS. 14 and 15). At that time, the smaller-diameter-side end faces 58 of the via conductors 57 formed in the resin insulating layers 46 are connected to the terminal pads 30. Further, through performance of etching in accordance with a conventionally known method (e.g., semiadditive method), a conductor layer 51 of a predetermined pattern is formed on each of the resin insulating layers 46.

Figure 16:
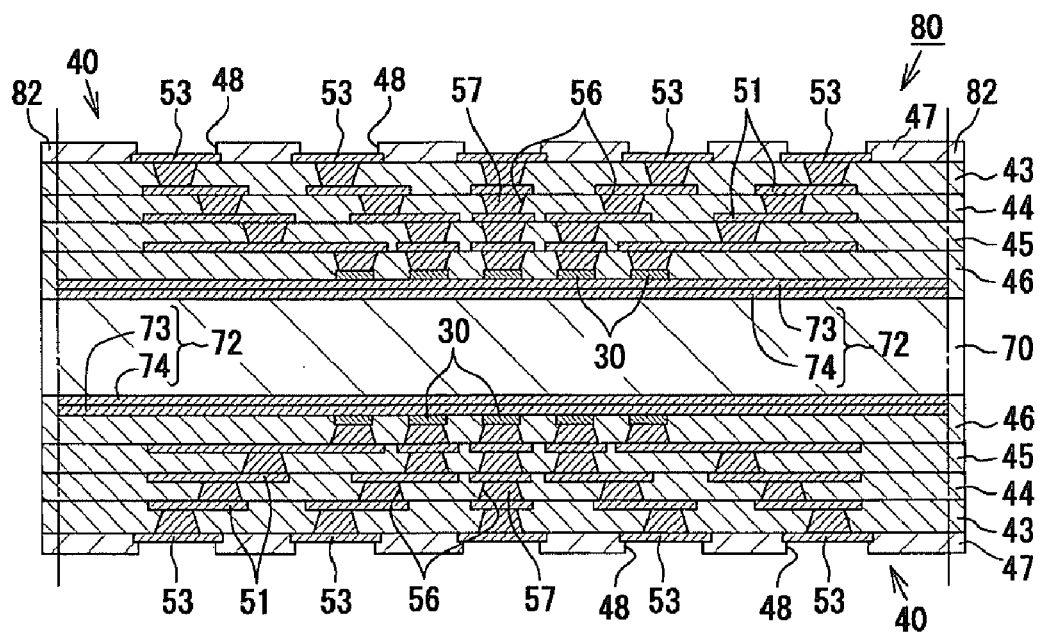
FIG. 16 is a schematic cross sectional view used for explaining the manufacturing steps.
Figure 17:
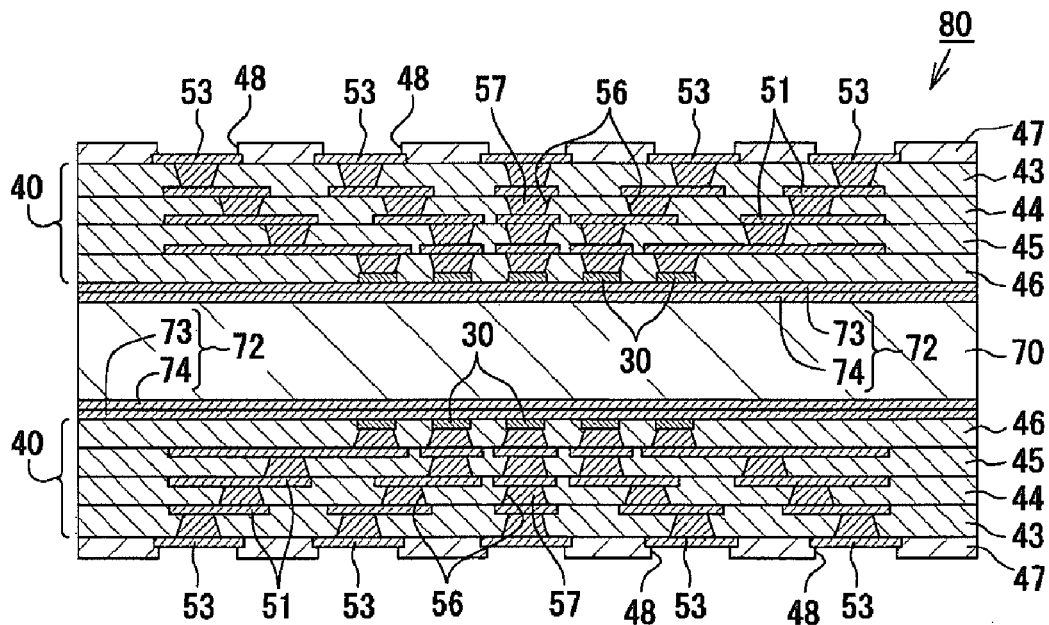
FIG. 17 is a schematic cross sectional view used for explaining the manufacturing steps.
Figure 18:
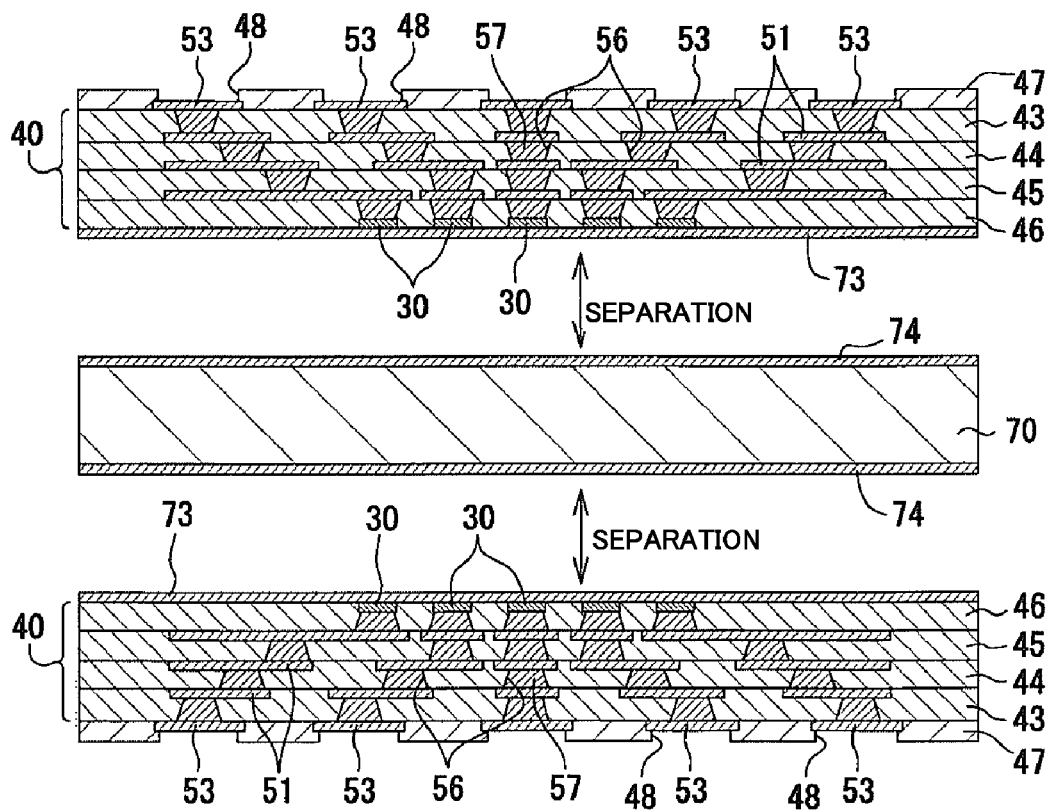
FIG. 18 is a schematic cross sectional view used for explaining the manufacturing steps.
Figure 19:
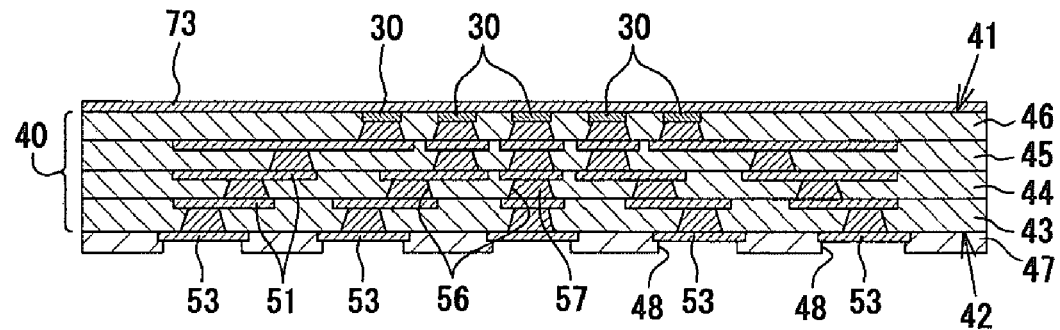
FIG. 19 is a schematic cross sectional view used for explaining the manufacturing steps.

The first through third resin insulating layers 43 to 45 and the remaining conductor layers 51 are formed by the same method as the method employed for formation of the above-described fourth resin insulating layers 46 and the above-mentioned conductor layers 51, and are stacked on the resin insulating layers 46 (see FIG. 16). Subsequently, a photosensitive epoxy resin is applied onto each resin insulating layer 43 having the pads 53 for BGA, and is cured, whereby a solder resist layer 47 is formed. Next, opening portions 48 are formed in the solder resist layer 47 through performance of exposure and development with a mask having a predetermined pattern disposed on the solder resist layer 47. As a result of performance of the above-described manufacturing steps, there is formed a laminate 80 in which the laminated metal sheet 72, the resin insulating layers 43 to 46, and the conductor layers 51 are stacked on each of opposite sides of the support substrate 70 (see FIG. 16). Notably, as shown in FIG. 16, a portion of the laminate 80 located on each laminated metal sheet 72 serves as a wiring stacked portion 40.

Subsequently, the laminate 80 is cut by use of a dicing machine (not shown) so as to remove a portion of the laminate 80 around the wiring stacked portions 40. At that time, the wiring stacked portions 40 are cut together with the support substrate 70 at the boundary between the wiring stacked portions 40 and a peripheral portion 82 around the wiring stacked portions 40 (see the chain line of FIG. 16). As a result of this cutting, outer edge portions of the laminated metal sheet 72 buried in the resin insulating layers 46 are exposed to the outside. That is, through removal of the peripheral portion 82, the area where the support substrate 70 and the resin insulating layers 46 are bonded together is lost. As a result, there is created a state in which the wiring stacked portions 40 are connected to the support substrate 70 only through the laminated metal sheets 72 (see FIG. 17).

In a subsequent support layer removing step, the laminate 80 is first separated into the wiring stacked portions 40 and the support substrate 70, whereby the copper foil layers 73 are exposed. Specifically, the two copper foil layers 73 and 74 of each laminated metal sheet 72 are separated from each other at the boundary therebetween so as to separate the wiring stacked portions 40 from the support substrate 70 (see FIGS. 18 and 19).

Figure 20:
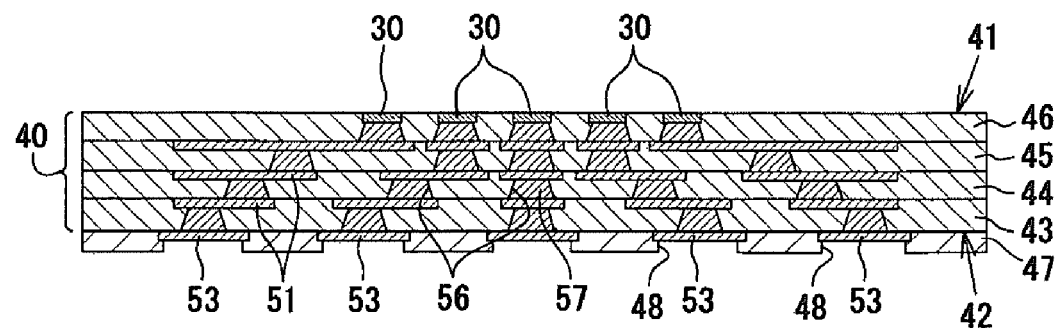
FIG. 20 is a schematic cross sectional view used for explaining the manufacturing steps.

Further, etching is performed on the copper foil layer 73 on the main face 41 of each wiring stacked portion 40 (the resin insulating layer 46) so as to remove the copper foil layer 73 and expose the gold layers 33 of the terminal pads 30, etc. from the main face 41 (see FIGS. 2, 3 and 20). Notably, in the multilayer wiring substrate 11 of the present embodiment, the gold layer 33 of each terminal pad 30 has an overhanging portion 33a. Therefore, a non-linear interface is formed between each terminal pad 30 and the resin insulating layer 46 as viewed in a cross section, and the interface becomes longer than that in the conventional structure. Therefore, etchant which dissolves copper becomes unlikely to invade into the interior of the wiring stacked portions 40, whereby etching out of the copper layer 31, which would otherwise occur due to invasion of the etchant, can be prevented.

In a subsequent solder-bump forming step, the solder bumps 54 for IC chip connection are formed on the plurality of terminal pads 30 formed on the outermost resin insulating layer 46 of the multilayer wiring substrate 11. Specifically, after solder balls are placed on the terminal pads 30 by use of an unillustrated solder ball mounting apparatus, the solder balls are heated to a predetermined temperature for reflow, whereby the solder bumps 54 are formed on the terminal pads 30. Similarly, solder bumps 55 are formed on the plurality of pads 53 for BGA formed on the resin insulating layer 43.

After that, the IC chip 21 is mounted on the wiring stacked portion 40 to be located within the IC-chip mounting region 23 (see FIG. 1). At that time, the terminals 22 of the IC chip 21 are aligned with the solder bump 54 on the wiring stacked portion 40. Subsequently, the solder bumps 54 are heated for reflow. As a result, the terminals 22 are joined to the solder bumps 54, and the IC chip 21 is mounted on the wiring stacked portion 40, whereby the semiconductor package 10 of FIG. 1 is completed.

Accordingly, the present embodiment provides the effects described below.

(1) According to the exemplary method for manufacturing the multilayer wiring substrate 11 of the present embodiment, when the terminal forming step is performed, the gold plating layers 33 of the terminal pads 30 and the positioning marks 59 are formed to have an overhanging portion 33a, which serves as an etching guard in a later step. Therefore, even when etchant which dissolves copper is used in the support layer removing step, the etchant is unlikely to invade into the interior of the wiring stacked portions 40 via the interfaces between the resin insulating layer 46 and the terminal pads 30 and the positioning marks 59. Thus, etching out of the copper plating layer 31, which would otherwise occur due to invasion of the etchant, can be prevented, and the terminal pads 30 and the positioning marks 59 which are excellent in terms of shape can be obtained at high yield. Further, use of the multilayer wiring substrate 11 manufactured by such a method improves the reliability of connection between the terminal pads 30 and the IC chip 21, to thereby realize the semiconductor package 10 which is excellent in terms of reliability. Notably, even when liquid other than etchant (e.g., cleaning liquid) which is apt to invade into the interior of the wiring stacked portions 40 is used, invasion of such liquid is prevented by the overhanging portion 33a of the gold plating layer 33, whereby change of the properties of the copper plating layer 31 is prevented.

(2) In the multilayer wiring substrate 11 of the present embodiment manufactured by the above-described manufacturing method, unlike the conventional structure in which the gold plating layer 33, the nickel plating layer 32, and the copper plating layer 31 have the same diameter, the diameter of the gold plating layer 33 is larger than those of the nickel plating layer 32 and the copper plating layer 31. Therefore, the area of the gold plating layer 33 increases somewhat. This configuration is convenient for formation of the solder bumps 54 on the terminal pads 30, and enhances the reliability of the solder bumps 54. Thus, the reliability of connection between the terminal pads 30 and the IC chip 21 can be improved. Further, since the gold plating layer 33 has the overhanging portion 33a, the area of the interface between each terminal pad 30 and the resin insulating layer 46 increases somewhat. As a result, the fixing strength of the terminal pads 30 to the resin insulating layer 46 can be increased.

Further, the multilayer wiring substrate 11 of the present embodiment has the positioning marks 59. Therefore, use of the positioning marks 59 for mounting the IC chip 21 onto the multilayer wiring substrate 11 allows accurate positioning between the IC chip 21 and the multilayer wiring substrate 11. In addition, since the positioning marks 59 have the same structure as the terminal pads 30, the copper plating layer 31 has not been etched out, so that the positioning marks 59 are excellent in overall shape. Therefore, when an automatic positioning operation is performed through image recognition, the positioning marks 59 can be recognized accurately. As a result, the shape accuracy of the solder bumps 54 and the mounting accuracy of components such as the IC chip 21 can be improved.

2. Second Embodiment

Next, a second exemplary embodiment of the present invention will be described with reference to FIGS. 21 to 24.

Figure 21:
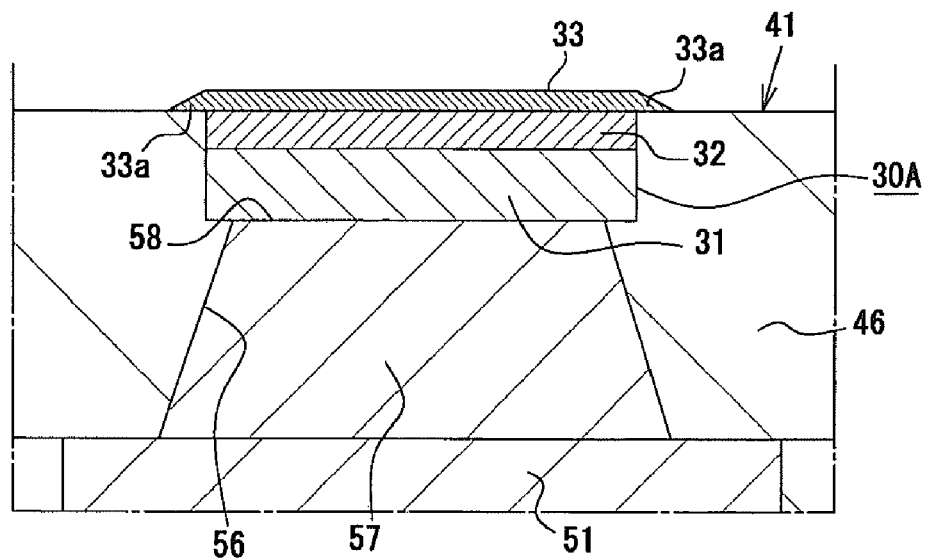
FIG. 21 is an enlarged cross sectional view showing a surface contact terminal of a multilayer wiring substrate of a second embodiment.
Figure 22:
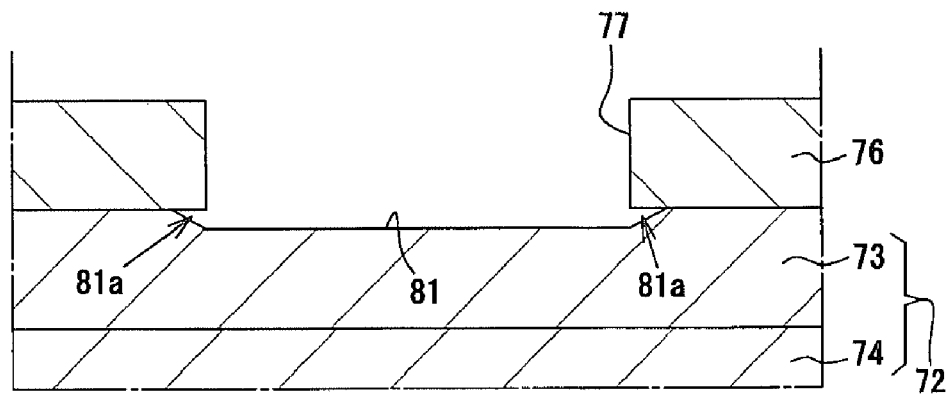
FIG. 22 is a partial enlarged cross sectional view used for explaining the steps of manufacturing the multilayer wiring substrate of the second embodiment.

As shown in FIG. 21, like the terminal pads 30 of the first embodiment, terminal pads 30A of a multilayer wiring substrate 11 of the second embodiment have a structure in which a copper plating layer 31, a nickel plating layer 32, and a gold plating layer 33 are stacked in this sequence, and the gold plating layer 33 has an overhanging portion 33a along the circumference thereof.

The multilayer wiring substrate 11 having the terminal pads 30A having such a structure can be manufactured by a method which is basically the same as the manufacturing method of the first embodiment. However, a method of forming the overhanging portion 33a in the terminal forming step which is employed in the present embodiment differs from that employed in the first embodiment. That is, a dry film 76 (thickness: about 15 μm), which serves as a resist (mask), is laminated on each of the laminated metal sheets 72. Next, through performance of exposure and development, openings 77 (diameter: 100 μm) are formed in the dry film 76 at predetermined positions thereof so as to expose portions of the surface of the copper foil layer 73. Subsequently, the exposed portions of the copper foil layer 73 are soft-etched by use of etchant which dissolves copper, whereby a soft-etched portion 81 having a depth of about 1 μm is formed (see FIG. 22). At that time, around each of the openings, the etchant acts in a region under the surface of the dry film 76, which surface is in contact with the support layer, whereby a clearance 81a is formed in that region. Notably, conditions (temperature, time, current density, etc.) of the etching are properly adjusted such that the clearance 81a has a shape corresponding to the shape of the overhanging portion 33a to be obtained.

Figure 23:
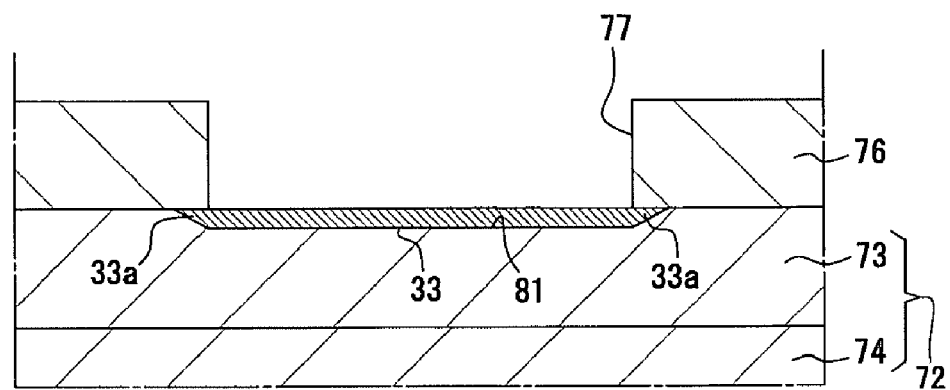
FIG. 23 is a partial enlarged cross sectional view used for explaining the manufacturing steps.
Figure 24:
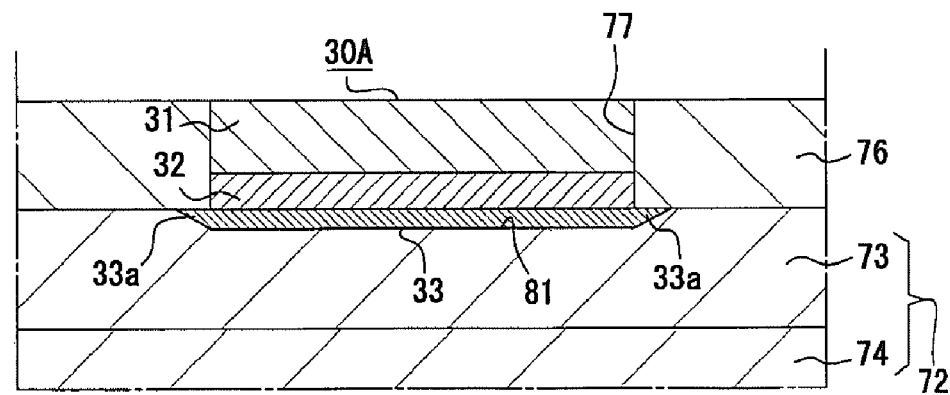
FIG. 24 is a partial enlarged cross sectional view used for explaining the manufacturing steps.

Subsequently, electro gold plating is first performed so as to form a gold plating layer 33 having a predetermined thickness as shown in FIG. 23. In the present embodiment, electro gold plating is performed to an extent such that gold fills the soft-etched portion 81 (a large diameter portion of the opening 77). Subsequently, a nickel plating layer 32 and a copper plating layer 31 are successively formed, whereby the terminal pads 30A having a three-layer structure are completed (see FIG. 24).

Even in the above-described manufacturing method of the present embodiment, when the terminal forming step is performed, the gold plating layer 33 having the overhanging portion 33a is formed. Therefore, etching out of the terminal pads 30A can be prevented, and the yield of the multilayer wiring substrate 11 can be increased. Further, the multilayer wiring substrate 11 manufactured by such a manufacturing method has the terminal pads 30A which are excellent in terms of reliability of connection between the terminal pads 30A and the IC chip 21.

3. Third Embodiment

Next, a third exemplary embodiment of the present invention will be described with reference to FIGS. 25 to 28.

Figure 25:
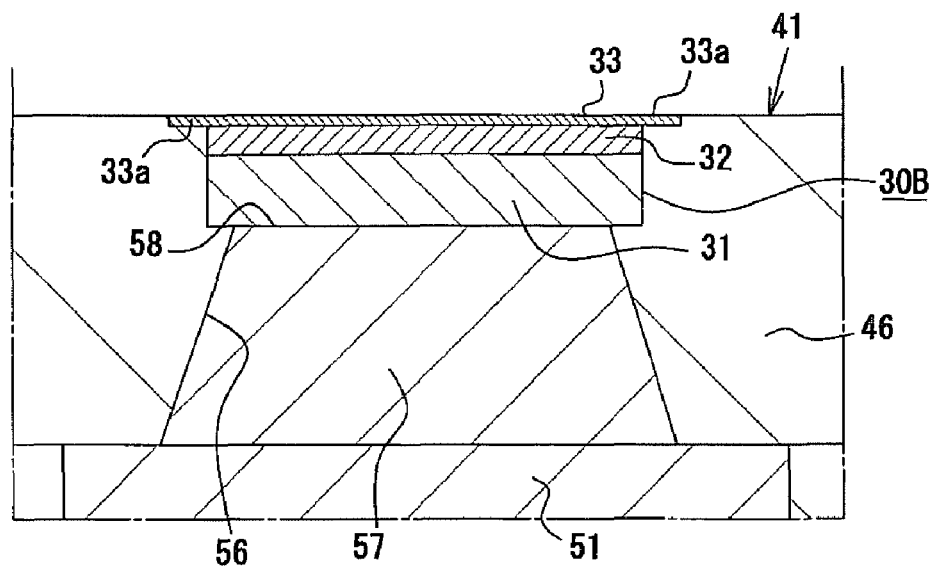
FIG. 25 is an enlarged cross sectional view showing a surface contact terminal of a multilayer wiring substrate of a third embodiment.
Figure 26:
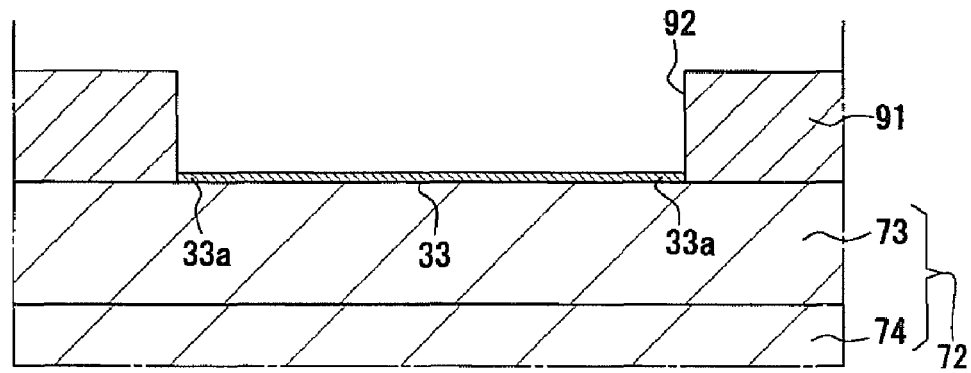
FIG. 26 is a partial enlarged cross sectional view used for explaining the steps of manufacturing the multilayer wiring substrate of the third embodiment.
Figure 27:
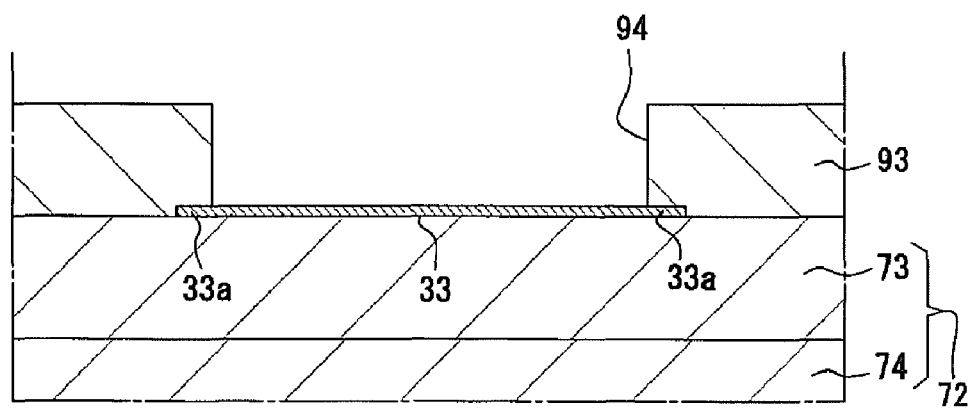
FIG. 27 is a partial enlarged cross sectional view used for explaining the manufacturing steps.
Figure 28:
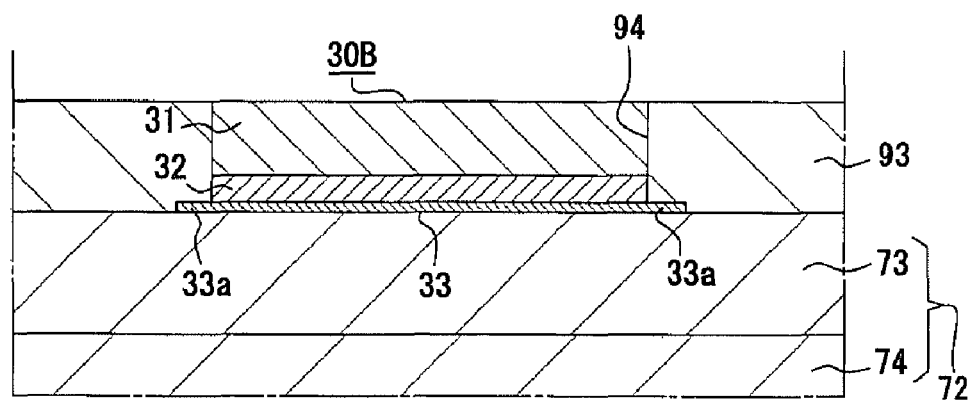
FIG. 28 is a partial enlarged cross sectional view used for explaining the manufacturing steps.

As shown in FIG. 25, like the terminal pads 30 of the first embodiment, terminal pads 30B of a multilayer wiring substrate 11 of the third embodiment have a structure in which a copper plating layer 31, a nickel plating layer 32, and a gold plating layer 33 are stacked in this sequence, and the gold plating layer 33 has an overhanging portion 33a along the circumference thereof.

The multilayer wiring substrate 11 having the terminal pads 30B having such a structure can be manufactured by a method which is basically the same as the manufacturing method of the first embodiment. However, a method of forming the overhanging portion 33a in the terminal forming step which is employed in the present embodiment differs from that employed in the first embodiment. That is, a dry film 91 (thickness: about 15 μm), which serves as a resist (first mask), is laminated on each of the laminated metal sheets 72. Next, through performance of exposure and development, openings 92 (first openings) having a diameter of about 105 μm to 110 μm are formed in the dry film 91 at predetermined positions thereof so as to expose portions of the surface of the copper foil layer 73. Subsequently, electro gold plating is performed so as to form a gold plating layer 33 having a predetermined thickness (see FIG. 26). A circumferential portion of the gold plating layer 33 shown in FIG. 26 will later become the overhanging portion 33a.

Next, the dry film 91 is removed, and a different dry film 93 (thickness: about 15 μm), which serves as a resist (second mask), is laminated thereon. Next, through performance of exposure and development, openings 94 (second openings) having a diameter of 100 μm are formed in the dry film 93 at predetermined positions thereof (see FIG. 27). Subsequently, electro nickel plating and electro copper plating are successively performed on the exposed surface of the gold plating layer 33, whereby the terminal pads 30B having a three-layer structure are completed (see FIG. 28).

Even in the above-described manufacturing method of the present embodiment, when the terminal forming step is performed, the gold plating layer 33 having the overhanging portion 33a is formed. Therefore, etching out of the terminal pads 30B can be prevented, and the yield of the multilayer wiring substrate 11 can be increased. Further, the multilayer wiring substrate 11 manufactured by such a manufacturing method has the terminal pads 30B which are excellent in terms of reliability of connection between the terminal pads 30B and the IC chip 21.

Notably, the present embodiment may be modified as follows.

Figure 29:
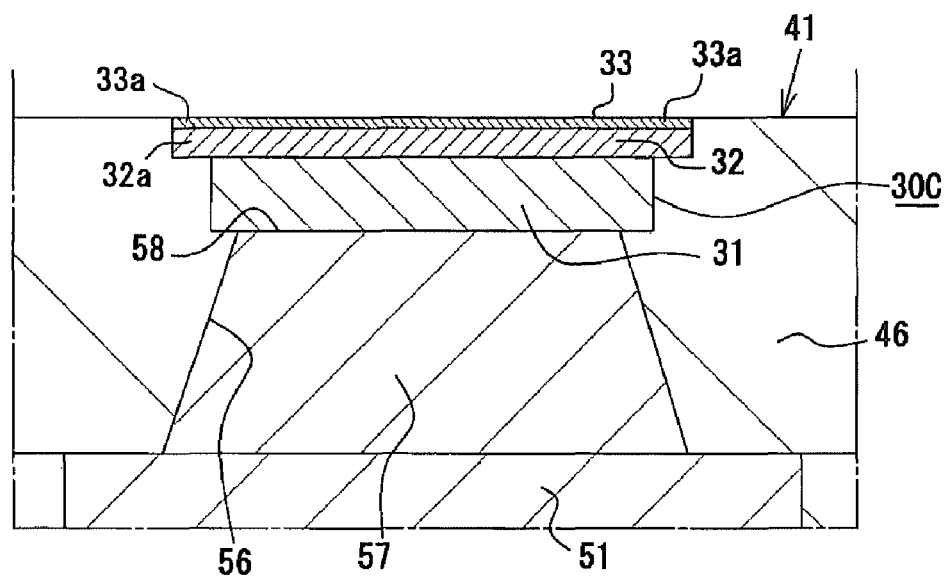
FIG. 29 is an enlarged cross sectional view showing a surface contact terminal of a multilayer wiring substrate of another embodiment.

In the above-described embodiments, the gold plating layer 33 is formed to be larger in diameter than the nickel plating layer 32 and the copper plating layer 31. However, there may be employed a structure such as that of a terminal pad 30C of another embodiment shown in FIG. 29. In the terminal pad 30C shown in FIG. 29, the gold plating layer 33 and the nickel plating layer 32 are formed to have the same diameter, which is greater than the diameter of the copper plating layer 31, and to have respective overhanging portions 33a and 32a. Notably, the structure shown in FIG. 29 enables the overhanging portions 33a and 32a to be formed thicker as compared with the case of the above-described embodiments.

Figure 30:
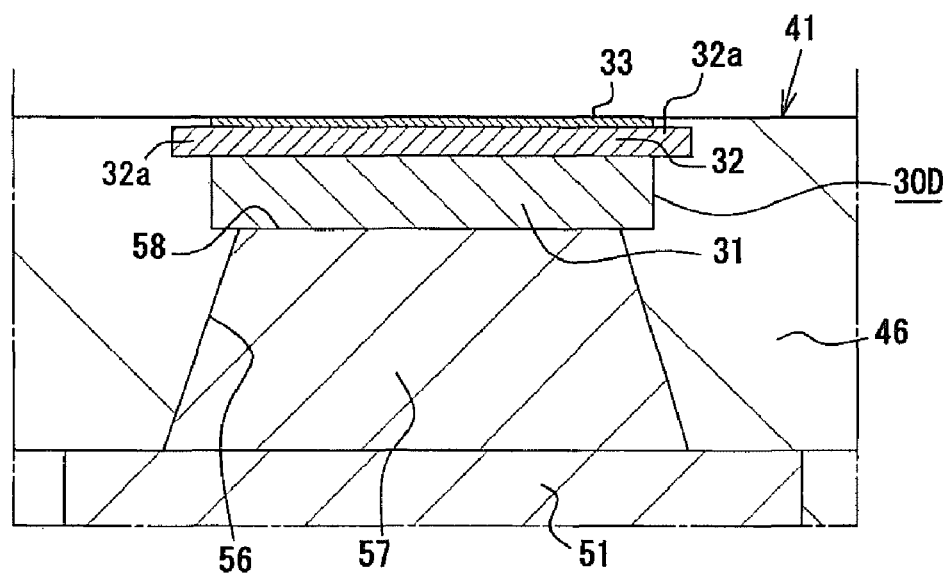
FIG. 30 is an enlarged cross sectional view showing a surface contact terminal of a multilayer wiring substrate of still another embodiment.

As in the case of a terminal pad 30D of still another embodiment shown in FIG. 30, the nickel plating layer 32 is formed to be larger in diameter than the gold plating layer 33 and the copper plating layer 31, and to have an overhanging portion 32a.

In the above-described embodiments, each of the via conductors 57 is a conductor which increases in diameter toward the back face 42 of the wiring stacked portion 40 (downward in FIGS. 1 and 2), and the terminal pads 30 are connected to the smaller-diameter-side end faces 58 of the via conductors 57. However, the embodiments may be modified such that each of the via conductors 57 is a conductor which decreases in diameter toward the back face 42 of the wiring stacked portion 40 (downward in FIGS. 1 and 2), and the terminal pads 30 are connected to the larger-diameter-side end faces of the via conductors 57.

In the above-described embodiments, the wiring stacked portion 40 is formed on each of the opposite sides of the support substrate 70. However, the wiring stacked portion 40 may be formed on only one side of the support substrate 70.

In the above-described embodiments, in addition to the IC chip 21, other electronic components may be mounted on the main face 41 and/or the back face 42 of the wiring stacked portion 40. An example of such an electronic component is a chip component which has a plurality of terminals on the back face or side face thereof (for example, a chip transistor, a chip diode, a chip resistor, a chip capacitor, a chip coil, a chip inductor, or the like).

Next, technological implementations suggested by the above-described embodiment are enumerated below.

(1) A multilayer wiring substrate having a laminated structure composed of conductor layers and resin insulating layers stacked alternately and in which a plurality of surface connection terminals to which terminals of a chip component are to be surface-connected are formed on a main face of the laminated structure, and a plurality of via conductors connected to the plurality of surface connection terminals are formed in the resin insulating layers, the multilayer wiring substrate being characterized in that the nickel layer and the copper layer are formed to have the same diameter, and the gold layer is formed such that the gold layer is larger in diameter than the nickel layer and the copper layer and has an overhanging portion which extends radially outward from the circumferences of the nickel layer and the copper layer.

(2) In the above-described implementation (1), the surface of the overhanging portion, which is a portion of the gold layer, has fine pits and projections such that the surface has a surface roughness Ra of 0.1 μm to 5 μm, inclusive.

DESCRIPTION OF REFERENCE NUMERALS

The following is a list of reference numerals as used in the application, and a description thereof:
11: multilayer wiring substrate
21: semiconductor integrated circuit element (IC chip) which serves as a chip component
22: terminal
30, 30A, 30B, 30C, 30D: terminal pad which serves as a surface connection terminal
31: copper plating layer which serves as a copper layer
32: nickel plating layer which serves as a nickel layer
33: gold plating layer which serves as a gold layer
32a, 33a: overhanging portion
40: wiring stacked portion which serves as a laminated structure
41: main face
43-46: resin insulating layer
51: conductor layer
57: via conductor
59: positioning mark
72: laminated metal sheet which serves as a support layer
76: dry film which serves as a mask
77: opening
77a: undercut
81: soft-etched portion
81a: clearance
91: dry which serves as a first mask
92: first opening
93: dry which serves as a second mask
94: second opening

What is claimed is:

1. A multilayer wiring substrate having a laminated structure composed of conductor layers and resin insulating layers stacked alternately and in which a plurality of surface connection terminals to which terminals of a chip component are to be surface-connected are formed on a main face of the laminated structure, and a plurality of via conductors connected to the plurality of surface connection terminals are formed in the resin insulating layers,
wherein each of the plurality of surface connection terminals has a structure in which a copper layer, a nickel layer, and a gold layer are stacked in sequence, and the gold layer is larger in diameter than at least the copper layer and has an overhanging portion which extends radially outward from a circumference of the copper layer.

2. The multilayer wiring substrate according to claim 1, wherein the multilayer wiring substrate does not have a core substrate, and, in each of the resin insulating layers, the diameter of each of the plurality of via conductors increases in the same direction.

3. The multilayer wiring substrate according to claim 1, wherein positioning marks having a same structure as the plurality of surface connection terminals are formed on the main face of the laminated structure.

4. The multilayer wiring substrate according to claim 2, wherein positioning marks having a same structure as the plurality of surface connection terminals are formed on the main face of the laminated structure.

5. A multilayer wiring substrate having a laminated structure composed of conductor layers and resin insulating layers stacked alternately and in which a plurality of surface connection terminals to which terminals of a chip component are to be surface-connected are formed on a main face of the laminated structure, and a plurality of via conductors connected to the plurality of surface connection terminals are formed in the resin insulating layers, wherein each of the plurality of surface connection terminals comprises a copper layer, a nickel layer, and a gold layer, wherein the nickel layer and the copper layer are formed to have a same diameter, and the gold layer is formed such that the gold layer is larger in diameter than the nickel layer and the copper layer and has an overhanging portion which extends radially outward from a circumferences of the nickel layer and the copper layer.

6. The multilayer wiring substrate according to claim 5, wherein the multilayer wiring substrate does not have a core substrate, and, in each of the resin insulating layers, the diameter of each of the plurality of via conductors increases in the same direction.

7. The multilayer wiring substrate according to claim 6, wherein positioning marks having a same structure as the plurality of surface connection terminals are formed on the main face of the laminated structure.

8. The multilayer wiring substrate according to claim 5, wherein positioning marks having a same structure as the plurality of surface connection terminals are formed on the main face of the laminated structure.

9. The multilayer wiring substrate according to claim 5, wherein a surface of the overhanging portion has fine pits and projections such that the surface of the overhanging portion has a surface roughness of 0.1 μm to 5 μm, inclusive.

* * * * *